US006785119B2

(12) United States Patent
Egger et al.

(10) Patent No.: US 6,785,119 B2
(45) Date of Patent: Aug. 31, 2004

(54) FERROELECTRIC CAPACITOR AND PROCESS FOR ITS MANUFACTURE

(75) Inventors: Ulrich Egger, Kanagawa-ken (JP); Haoren Zhuang, Tokyo-to (JP); Karl Hornik, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/307,230

(22) Filed: Nov. 29, 2002

(65) Prior Publication Data

US 2004/0105213 A1 Jun. 3, 2004

(51) Int. Cl.[7] .................................................. H01G 4/228

(52) U.S. Cl. ................................ 361/306.1; 361/306.3; 361/321.1; 361/321.5; 361/302; 361/303

(58) Field of Search ........................... 361/306.1, 306.3, 361/321.1, 321.4, 321.5, 303, 305, 311, 330; 257/285, 295, 303; 438/253, 254

(56) References Cited

U.S. PATENT DOCUMENTS 6,211,542 B1 * 4/2001 Eastep et al. ............... 257/295
6,492,673 B1 * 12/2002 Fox et al. ................... 257/303

* cited by examiner

*Primary Examiner*—Anthony Dinkins
*Assistant Examiner*—Nguyen T. Ha
(74) *Attorney, Agent, or Firm*—Fish & Richardson P.C.

(57) ABSTRACT

Forming a capacitor, by (a) forming a matrix of ferroelectric capacitor elements on a substrate, (b) forming a CAP layer over the ferroelectric capacitor elements, and (c) etching the CAP layer to a more uniform thickness. A capacitor that has a substrate layer, a matrix of ferroelectric capacitor elements including a first electrode layer substantially fixed relative to the substrate, a second electrode layer, and a ferroelectric layer sandwiched between the first and second electrode layers is disclosed. The capacitor has a shoulder layer extending from the substrate to the matrix, and a CAP layer etched to have substantially constant thickness covering sides of the matrix extending beyond the substrate.

10 Claims, 1 Drawing Sheet

9
15
13
7
11
1

FERROELECTRIC CAPACITOR AND PROCESS FOR ITS MANUFACTURE

FIELD OF THE INVENTION

The present invention relates to a method of patterning capacitors, more particularly for the fabrication of ferroelectric capacitors (FeRAMs) which find application in a number of devices including non-volatile memories and for high-k dynamic random access memories (DRAMs). Ferroelectic capacitors have the advantage that they are able to switch quickly and can be fabricated on a single VLSI chip. They also have the endurance of DRAM, the fast read/write times of SRAM and the non-volatility of flash.

BACKGROUND OF THE INVENTION

Conventionally, an FeRAM is manufactured by depositing a ferroelectric film, such as lead zirconate titanate (PZT), strontium bismuth tantalum oxide (SBT), bismuth lanthanum titanium oxide (BLT) or strontium ruthenium oxide (SRO) on a first, planar, electrode film, and forming a second electrode film over the ferroelectric layer. The second electrode layer and the ferroelectric film are then etched using a reactive ion etch method, after which the first electrode film is etched using a similar method. The result is a number of stacks comprising a first and second electrode film sandwiching the ferroelectric film.

After etching of the individual FeRAM capacitor structure, it is conventional to form an encapsulation (CAP) layer of $Al_2O_3$ to prevent diffusion by $H_2$ and $O_2$ into the structure. This layer is formed by a sputtering process. The basic FeRAM elements are ideally formed with very deep sidewalls. The sputtering method of forming the CAP layer has the disadvantage of low coverage of steep sidewalls of FeRAM elements. Whilst this problem could be solved by forming the CAP layer by atomic layer deposition (ALD), it would require use of expensive specialist equipment.

It would be desirable to improve the uniformity of the sidewall coverage without using ALD.

SUMMARY OF THE INVENTION

The present invention forms a thicker $Al_2O_3$ cap layer, preferably by sputtering and then etching back providing a more uniform coverage without the use of ALD.

According to a first aspect of the present invention a capacitor is formed using a method comprising the steps of:

forming a ferroelectric capacitor element on a substrate;

forming a CAP layer over the ferroelectric capacitor element; and etching the CAP layer to a more uniform thickness.

For the avoidance of doubt, reference herein to "forming a ferrorelectric capacitor element on a substrate" includes the possibility of one or more intermediate layers being formed between the capacitor element and the substrate.

According to a second aspect of the present invention a capacitor comprises:

a substrate layer;

a matrix of ferroelectric capacitor elements including a first electrode layer substantially fixed relative to the substrate, a second electrode layer, and a ferroelectric layer sandwiched between the first and second electrode layers;

a shoulder layer extending from the substrate to the matrix; and a CAP layer etched to have substantially constant thickness covering sides of the matrix extending beyond the substrate.

In most preferred embodiments, the CAP layer is $Al_2O_3$. Also, in most preferred embodiments, it is formed by sputtering. However, it could instead of $Al_2O_3$ be SiN, Ti-Oxide, HPO2 or ZrO2, for example. The average thickness of the CAP layer on top of the device (above the second electrode) before etching is preferably from 10 nm to 100 nm, more preferably from 30 nm to 40 nm.

The CAP layer May for example be etched-back using a reactive ion etching (RIE) method. Such a method for etching electrically conductive and electrically insulating materials is well known.

Preferably, after etching, the average thickness of the CAP layer on top of the device is from 5 nm to 30 nm.

Further uniformity and integrity of the CAP layer structure can be obtained by depositing a further layer of the same material over the etched primary CAP layer, for example to an average thickness of from 5 nm to 30 nm, preferably from 10 to 15 nm.

According to a second aspect of the present invention, there is provided a capacitor formed in accordance with the method of the first aspect of the present invention.

BRIEF DESCRIPTION OF THE DRAWINGS

The present invention will now be described, by way of example, with reference to the accompanying drawings, in which.

DETAILED DESCRIPTION OF THE INVENTION

Figure 1:
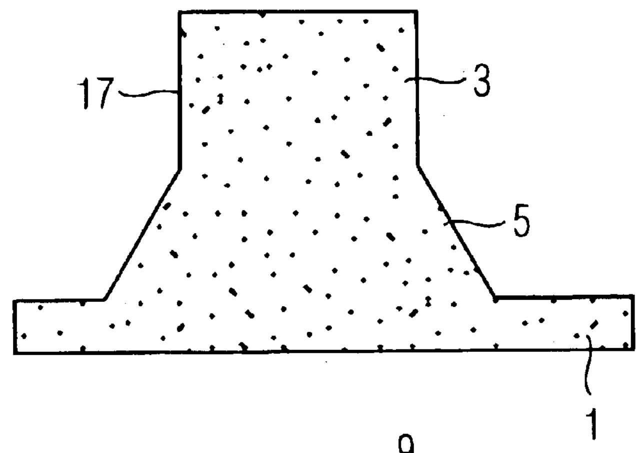
FIG. 1 shows the first step of a method according to the present invention including the capacitor walls prior to sputtering of the CAP.

As shown in FIG. 1, on a substrate 1 is formed a ferroelectric capacitor element 3. The layer structure of this element 3 is not shown but it is formed by the conventional technique of forming a first electrode layer above the substrate, a ferroelectric layer above the first electrode layer and then a second electrode layer above the ferroelectric layer. The upper (second) electrode layer and the ferroelectric layer are etched by the RIE method. The first electrode layer is then etched by the same method. This leaves a matrix of such capacitor elements or an isolated capacitor element on a chip comprising other components, depending on the desired application.

After the second etching, a shoulder 5 is often left at the bottom of the individual capacitor element stack, whereas other parts of the sidewall of the capacitor element 3 have steep taper angles.

Figure 2:
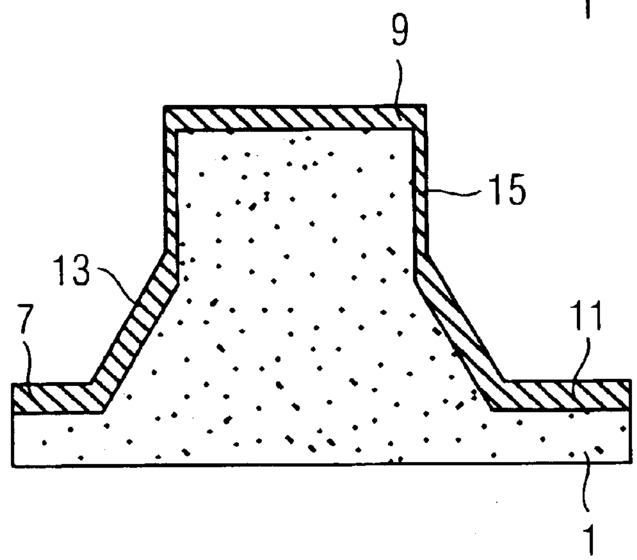
FIG. 2 shows the second step in the method according to the present invention including the sputtered CAP.

Next, as shown in FIG. 2, a CAP layer 7 of $Al_2O_3$ (or other materials such as SiN, Ti-Oxide, HPO2 or ZrO2 in alternative embodiments) is applied by sputtering to cover the whole external surface of the capacitor element stack. However, the sputtering process results in thicker CAP layers covering horizontal and low incline areas and thinner CAP layers covering the more horizontally oriented layers. For example, the upper surface 9, above the second electrode layer (not shown) of the capacitor element and that portion 11 over the exposed substrate, together with the portion 13 covering the shoulder 5, are thicker than the more vertically oriented region 15 of the CAP layer covering the side wall 17 of the element. In the present invention, the CAP layer is deposited to a greater thickness than is done in the conventional technique. The CAP layer 9 in FIG. 2 can, for example, have a thickness approximately in the range of 10–100 nm, preferably 30–40 nm or approximately 40 nm, which is thicker than that applied in the conventional technique.

Figure 3:
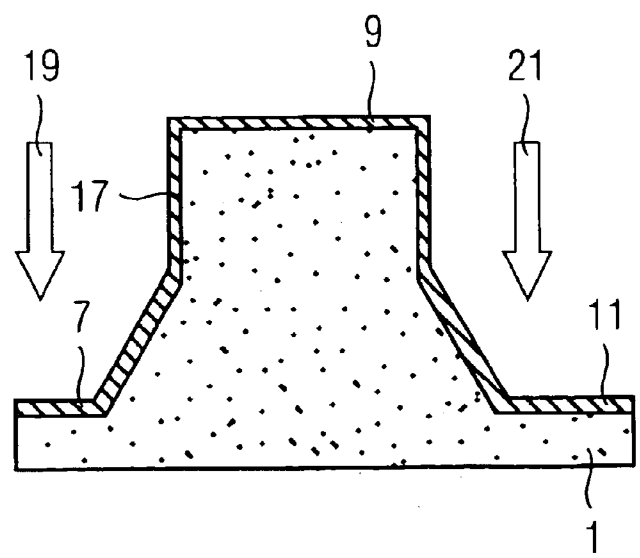
FIG. 3 shows the third step in the method according to the present invention including the more uniform etched sidewalls.

Therefore, as shown in FIG. 3 and according to the invention, the $Al_2O_3$ film 7 is sputtered sufficiently thick to allow etch back by RIE (denoted by arrows 19, 21). The RIE etch process has high anisotropy (properties that differ according to the direction of measurement) resulting in faster etching at the more horizontally oriented regions than the more vertically oriented regions. Thus, the applied CAP film 7 is reduced in thickness so that the upper region 9 and the region 11 over the substrate and region 13 over the shoulder are selectively reduced to more closely have the same thickness as the region 15 over the side wall 17. After this etching process, the region 9 of the CAP film above the capacitor stack can have a thickness of between approximately 5–30 nm, preferably 10–15 nm or approximately 10 nm.

In a modification of the described embodiment (not illustrated), a further thin $Al_2O_3$ layer is applied over the whole structure so that its thickness above the top region 9 of the CAP film is between approximately 5–30 nm, preferably 10–15 nm or approximately 10 nm. Alternatively, the further layer could be a material similar to, but different than $Al_2O_3$. In alternative embodiments making use of materials other than $Al_2O_3$ (for example SiN, Ti-Oxide, HPO2 or ZrO2) as the primary CAP layer, for example, the further layer can be similar to one of these other materials.

What is claimed is:

1. A method of forming a capacitor, the method comprising the steps of:

forming a matrix of ferroelectric capacitor elements on a substrate;

forming a CAP layer over the ferroelectric capacitor elements; and etching the CAP layer to provide a CAP layer having a substantially uniform thickness covering sides of the matrix extending beyond the substrate.

2. The method of claim 1, wherein the CAP layer is formed before etching is formed by sputtering.

3. The method of claim 1, wherein the CAP layer comprises $Al_2O_3$.

4. The method of claim 1, wherein the ferroelectric capacitor elements respectively comprise a first electrode layer, a ferroelectric layer above the first electrode layer and a second electrode layer above the first electrode layer.

5. The method of claim 4, wherein before the CAP layer is etched, the CAP layer above the second electrode layer has an average thickness of from 10 nm to 100 nm, preferably from 30 nm to 40 nm.

6. The method of claim 4, wherein after etching above, the second electrode layer, the CAP layer has an average thickness of from 5 nm to 30 nm, preferably from 10 nm to 15 nm.

7. The method of claim 1, wherein after etching of the CAP layer, a further layer of the same material is formed over the CAP layer.

8. The method of claim 7, wherein the further layer has an average thickness above the second electrode layer of from 5 nm to 30 nm.

9. A capacitor comprising:

a substrate layer;

a matrix of ferroelectric capacitor elements including a first electrode layer substantially fixed relative to the substrate, a second electrode layer, and a ferroelectric layer sandwiched between the first and second electrode layers;

a shoulder layer extending from the substrate to the matrix; and a CAP layer etched to have substantially constant thickness covering sides of the matrix extending beyond the substrate.

10. The capacitor of claim 9, wherein the CAP layer has an average thickness of 5 nm to 30 nm.

* * * * *